United States Patent
Löll et al.

(10) Patent No.: US 6,267,386 B1
(45) Date of Patent: Jul. 31, 2001

(54) RING SEAL

(75) Inventors: Achim Löll, Hesseneck; Günter Trogisch, Seeheim-Jugenheim; Peter Schäfer, Darmstadt-Eberstadt, all of (DE)

(73) Assignee: Firma Carl Freudenberg, Weinheim (DE)

( * ) Notice: Subject to any disclaimer, the term of this patent is extended or adjusted under 35 U.S.C. 154(b) by 0 days.

(21) Appl. No.: 09/338,861

(22) Filed: Jun. 23, 1999

(30) Foreign Application Priority Data

Jun. 23, 1998 (DE) .................................. 198 27 772

(51) Int. Cl.[7] ...................................... F16J 15/06
(52) U.S. Cl. ........................... 277/654; 277/609; 277/627
(58) Field of Search ................... 277/609, 612, 277/627, 654, 653, 652, 637, 919, 941, 944

(56) References Cited

U.S. PATENT DOCUMENTS

| 2,026,854 | * | 1/1936 | Victor .......................... 277/654 X |
| 2,034,610 | * | 3/1936 | Dickson ....................... 277/654 X |
| 2,520,089 | * | 8/1950 | Lippincott .................... 277/609 X |
| 4,002,344 | * | 1/1977 | Smith ........................... 277/609 |
| 4,095,809 | * | 6/1978 | Smith ........................... 277/609 X |
| 4,626,462 | * | 12/1986 | Kober et al. ................. 428/137 |
| 4,765,633 | * | 8/1988 | Hossack ....................... 277/654 X |
| 4,810,454 | * | 3/1989 | Belter .......................... 277/654 X |
| 5,100,492 | * | 3/1992 | Kober et al. ................. 156/250 |
| 5,121,929 | * | 6/1992 | Cobb ............................ 277/627 X |
| 5,142,448 | * | 8/1992 | Kober et al. ................. 361/751 |
| 5,144,534 | * | 9/1992 | Kober ........................... 361/751 |
| 5,793,150 | * | 8/1998 | Kober et al. ................. 310/338 |
| 5,975,539 | * | 11/1999 | Ueda et al. ................... 277/627 X |

FOREIGN PATENT DOCUMENTS 40 38 394   8/1992  (DE) .

* cited by examiner

Primary Examiner—Anthony Knight
Assistant Examiner—Robert G. Santos
(74) Attorney, Agent, or Firm—Kenyon & Kenyon

(57) ABSTRACT

A ring seal for insertion into the sealing gap between a housing and a housing cover, including a soft elastic sealing body and a flexible conducting strip passing through the sealing body in the transverse direction. The sealing body and the flexible conducting strip are stiffened in the sealing gap by a stiffening element. The stiffening element has an elasticity modulus E and a shear modulus G that are higher than the respective values of the conducting strip. The conducting strip is not substantially larger than the spatial extension of the sealing gap.

13 Claims, 2 Drawing Sheets

RING SEAL

BACKGROUND OF THE INVENTION

The invention relates to a ring seal to be introduced in the sealing gap between a housing and a housing cover, including a soft elastic sealing body and a flexible conducting strip that passes through the sealing body in the transverse direction.

Such a ring seal is known from German Offenlegungsschrift 4 038 394. It is attached to a non-bending support, which divides the housing into two partial chambers under the housing cover. Therefore the volume contained in the housing cannot be fully used.

SUMMARY OF THE INVENTION

The object of the present invention is to further develop such a ring seal so that the housing space is better utilized, weight is reduced and assembly is facilitated.

This object is achieved according to the present invention with a ring seal for insertion into the sealing gap between a housing and a housing cover, and includes a soft elastic sealing body and a flexible conducting strip passing through the sealing body in the transverse direction. The sealing body and the flexible conducting strip are stiffened within the sealing gap using a stiffening element.

In the ring seal according to the present invention, the stiffening element has an elasticity modulus E and a shear modulus G, which are greater than the respective values of the conducting strip. The conducting strip does not substantially exceed the spatial extension of the sealing gap. This considerably facilitates the insertion of the sealing body and the flexible conducting strip into the sealing gap, with the additional advantage that these two elements cannot be unintentionally damaged as a result of incorrect insertion when the housing cover is subsequently pressed against the housing. Yet the ring seal has a substantially lower weight compared to the embodiment according to the related art, material is economized in its manufacture, and the entire inner space of the housing is available for secondary purposes when it is used as intended. In many cases, the housing can therefore be made smaller than previously, which is associated with additional advantages. Fully automatic assembly is possible without problems.

For reasons of space economy, the sealing gap may have to be configured to be uneven. Even with such a design, a ring seal made in a more even shape can be used if the stiffening element can be subsequently deformed. With such a design, the stiffening element can be adapted to the shape of the sealing gap before or during assembly, the associated cost being easily offset by the advantage resulting from easier manufacture.

The stiffening element may be made of any sufficiently non-bending material, for example, a hard plastic or metal. It has proven to be particularly advantageous to use stiffening elements made of sheet metal. In addition to their particularly inexpensive availability, they are distinguished by the fact that sealing bodies made of rubber can be attached to them by vulcanization in a particularly reliable manner. Their toughness is also sufficiently good to provide sufficient strength against stresses occurring during assembly. In general, their thickness is between 0.2 and 5 mm; when aluminum is used, the thickness is between 0.4 and 2.0 mm.

The stiffening element can have a lateral projection from the sealing gap at least at one point for attaching secondary units. A fuel delivery pump, for example, can be attached to such a projection, with the additional advantage that vibrations generated by the fuel delivery pump during its intended use are acoustically insulated with respect to the housing.

The stiffening element may laterally overlap the sealing body in at least one direction, with essentially non-deformable spacers being provided in the area laterally adjacent to the sealing body; these spacers limit the deformation of the sealing body to an optimum value when the housing cover is pressed against the housing. The spacer can be formed by at least one fin, one rise, and/or one projection of the stiffening element.

According to another embodiment, the stiffening element can have, laterally adjacent to the sealing body, centering aids for the sealing body in addition to the sealing body. Such centering aids may be formed by tapped through holes, for example. They prevent the ring seal from being accidentally displaced during the intended use with respect to the correct position in the sealing gap. In order to ensure that the sealing body, normally made of elastomeric material, is not pressed in an impermissible manner to the surfaces to be sealed, it has been proven to be advantageous if the tapped through holes are surrounded by essentially non-deformable spacers that span the sealing gap and limit the deformation of the sealing body to an optimum value when the bolts passing through the tapped through hole are tightened during the intended use. In particular, when sealing bodies contacting the surfaces to be sealed with sealing lips are used, such a design is of great advantage. Such sealing bodies also have the advantage that relatively little polymeric material is needed for their manufacture.

DETAILED DESCRIPTION

Figure 1:
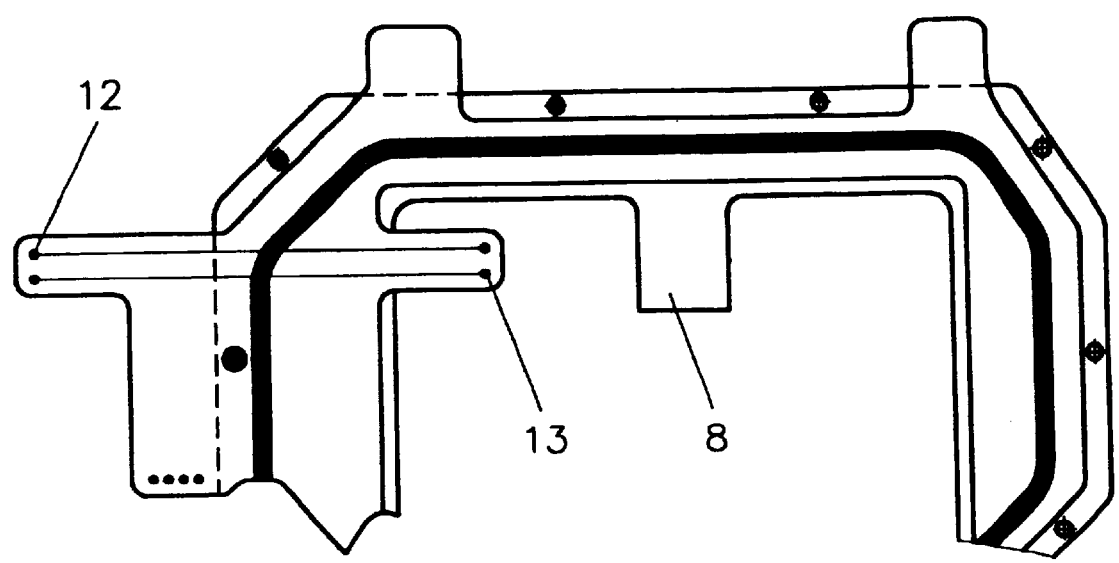
FIG. 1 shows a section of a ring seal constructed according to the principles of the invention, viewed from above.
Figure 2:
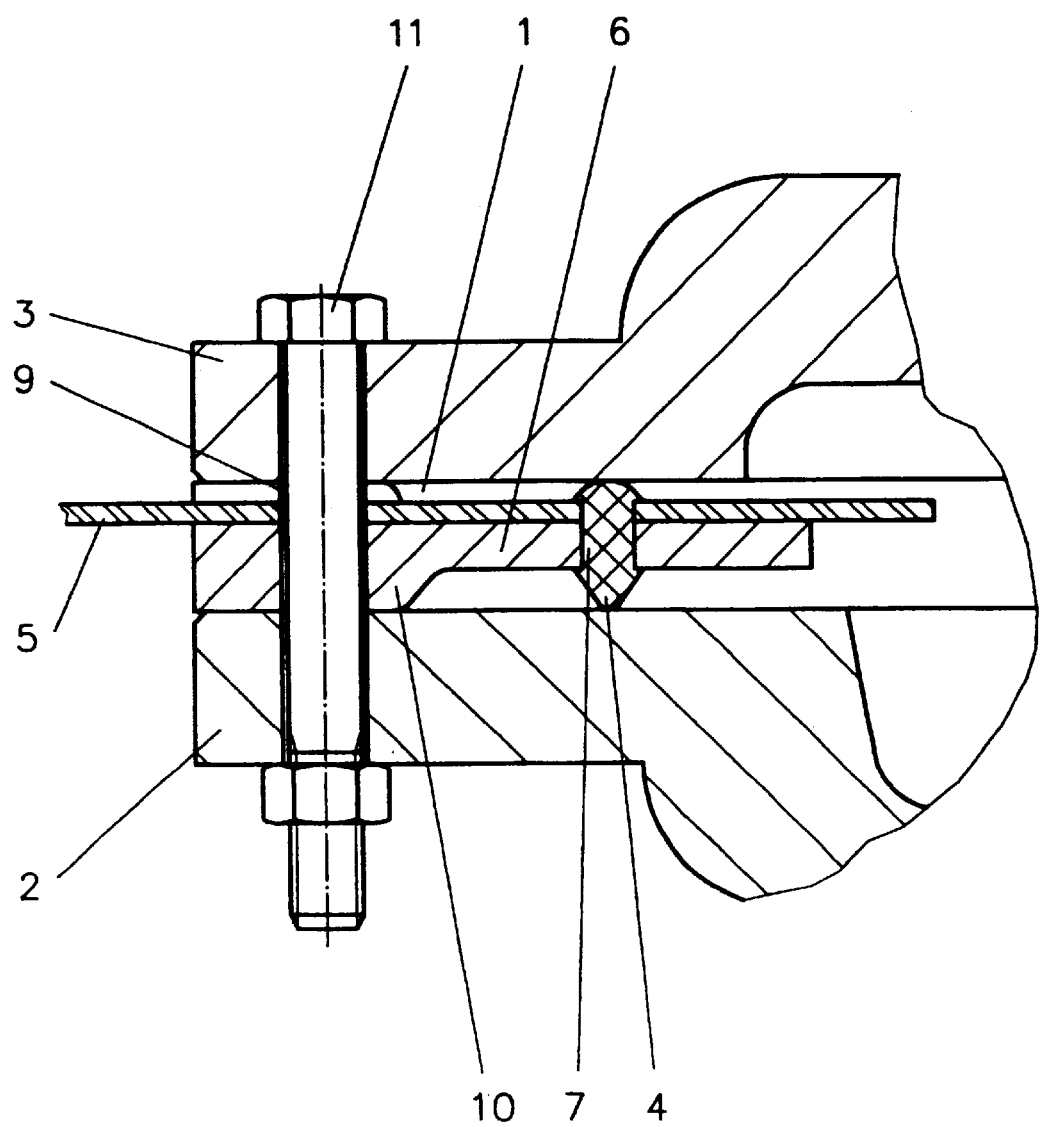
FIG. 2 is a partial cross-sectional view through a housing into which the ring seal of the invention is inserted.

The ring seal illustrated in FIG. 1 is intended for insertion in a sealing gap 1 between a housing 2 and a housing cover 3. It includes a soft elastic sealing body 4 and a flexible conducting strip 5 passing through sealing body 4 in the transverse direction. Sealing body 4 and flexible conducting strip 5 are stiffened in sealing gap 1 by a stiffening element 6, which is not substantially larger than the spatial extension of sealing gap 1 in the lateral direction (FIG. 2). Stiffening element 6 is made of an aluminum sheet having a thickness of 0.2 to 5 mm, preferably 0.8 mm, over which the one flexible conducting strip 5 runs in the transverse direction. The aluminum sheet is provided with tapped through holes, which also serve as centering aids 9 for subsequently inserted bolts 11, and with other cutouts at points 7 distributed in the peripheral direction, through which the partial bodies of sealing body 4 located on both sides of stiffening element 6 are designed in one piece smoothly transitioning into one another. Additional safety is against leakage is thus obtained along with the sure positioning of sealing body 4 on stiffening body 6.

Sealing body 4 is made of rubber having a Shore A hardness of approximately 70. TPE can also be used. It contacts the surfaces to be sealed on both sides with at least one sealing lip of a profile that tapers in a wedge shape in the direction of the surfaces and is rounded in the area of the contact zones. Alternative cross sections are known to those skilled in the art in designing static seals made of elastomeric materials.

In order to guarantee optimum pressing against the surfaces to be sealed when used as intended, spacers 10 evenly distributed in the peripheral direction are provided, which form an integral part of stiffening element 6, surround the tapped through holes and are essentially non-deformable. When bolts 11 are tightened, the surfaces of housing 2 and housing cover 3 opposite each other in the area of sealing gap 1 engage with non-bending spacers 10. The distance between the surfaces to be sealed is thus set at the value that provides optimum pressing of sealing body 4 against the surfaces to be sealed.

A flexible conducting strip 5, passing through sealing body 4 in the transverse direction, is connected to stiffening element 6 in a leak-proof manner. The flexible conducting strip may be made of a polyimide-copper film having a thickness of approximately 50 μm and having electrical conductors manufactured by a printing and/or etching process or are made of thin wires connected to the film by direct fusing into the foil surface on at least one side. As an alternative, the conductors may take the form of a grid stamped from a copper sheet and laminated between two plastic films. In the embodiment illustrated, the conductors end in contacts 12, 13, intended to be connected to a power supply and a load, respectively. The latter may be attached, for example, to a projection 8 of stiffening element 6.

What is claimed is:

1. A the ring seal for insertion into a sealing gap between a housing and a housing cover, comprising:
   a soft elastic sealing body;
   a flexible conducting strip transversely passing through the sealing body; and
   a stiffening element for stiffening the sealing body and the flexible conducting strip within the sealing gap, wherein the stiffening element has an elasticity modulus E and a shear modulus G that are higher than the respective values of the conducting strip, and the conducting strip is not substantially larger than the width of the sealing gap and wherein the stiffening element has two sides and
   wherein the sealing body passes through the stiffening element at at least one point and has partial bodies located on both sides of the stiffening element that are designed in one piece smoothly transitioning into each other.

2. The ring seal according to claim 1, wherein the stiffening element is plastically deformable.

3. The ring seal according to claim 2, wherein the stiffening element is made of sheet metal.

4. The ring seal according to claim 1, wherein the stiffening element has a projection, exiting laterally from the sealing gap, forming at least one point for attachment of secondary units.

5. The ring seal according to claim 1, wherein the stiffening element has centering aids for the sealing body.

6. The ring seal according to claim 5, wherein the centering aids are formed by tapped through holes.

7. The ring seal according to claim 6, wherein at least one of the tapped through holes is surrounded by spacers.

8. A the ring seal for insertion into a sealing gap between a housing and a housing cover, comprising:
   a soft elastic sealing body;
   a flexible conducting strip transversely passing through the sealing body; and
   a stiffening element for stiffening the sealing body and the flexible conducting strip within the sealing gap, wherein the stiffening element has an elasticity modulus E and a shear modulus G that are higher than the respective values of the conducting strip, and the conducting strip is not substantially larger than the width of the sealing gap,
   wherein the stiffening element laterally overlaps the sealing body to in at lease one direction, and essentially non-deformable spacers are provided in the area laterally adjacent to the sealing body, which limit the deformation of the sealing body to an optimum value when the housing cover and the housing are pressed together.

9. The ring seal according to claim 8, wherein the stiffening element has a projection, exiting laterally from the sealing gap, forming at least one point for attachment of secondary units.

10. The ring seal according to claim 8, wherein the stiffening element has centering aids for the sealing body.

11. The ring seal according to claim 10, wherein the centering aids are formed by tapped through holes.

12. The ring seal according to claim 11, wherein at least one of the tapped through holes is surrounded by spacers.

13. A ring seal for insertion into a sealing gap between a housing and a housing cover, comprising:
   a soft elastic sealing body;
   a flexible conducting strip transversely passing through the sealing body; and
   a stiffening element for stiffening the sealing body and the flexible conducting strip within the sealing gap, wherein the stiffening element has an elasticity modulus E and a shear modulus G that are higher than the respective values of the conducting strip, and the conducting strip is not substantially larger than the width of the sealing gap,
   wherein the stiffening element laterally overlaps the sealing body in at least one direction, and essentially non-deformable spacers are provided in the area laterally adjacent to the sealing body which limit the deformation of the sealing body to an optimum value when the housing cover and the housing are pressed together, a spacer is formed by at least one web, one rise, or one projection of the stiffening element.

* * * * *